United States Patent [19]
Johnson

[11] Patent Number: 5,234,529
[45] Date of Patent: Aug. 10, 1993

US005234529A

[54] PLASMA GENERATING APPARATUS EMPLOYING CAPACITIVE SHIELDING AND PROCESS FOR USING SUCH APPARATUS

[76] Inventor: Wayne L. Johnson, 12019 S. Appaloosa Dr., Phoenix, Ariz. 85044

[21] Appl. No.: 774,557

[22] Filed: Oct. 10, 1991

[51] Int. Cl.$^5$ .................... C23C 15/00; C23F 1/00
[52] U.S. Cl. ..................... 156/345; 118/723; 204/298.34
[58] Field of Search ............ 204/192.32, 298.11, 204/298.31, 298.34; 156/643, 345; 118/723

[56] References Cited

U.S. PATENT DOCUMENTS 4,918,031 4/1990 Flamm et al. ............ 204/192.32 X

Primary Examiner—Nam X. Nguyen
Attorney, Agent, or Firm—Michael Y. Epstein

[57] ABSTRACT

A plasma generating apparatus includes a plasma containing region and an R.F. coil for generating R.F. electric fields within the plasma region for creating a plasma from a gas flowed through the region. A capacitive shield is disposed between the coil and the plasma region for limiting the amount of capacitive coupling while not completely eliminating it, between the R.F. coil and the plasma region. The shield can include a means for varying the shielding effect thereof during processes employing the plasma.

12 Claims, 9 Drawing Sheets

PLASMA GENERATING APPARATUS EMPLOYING CAPACITIVE SHIELDING AND PROCESS FOR USING SUCH APPARATUS

BACKGROUND OF THE INVENTION

This invention relates to plasma generating apparatus and to processes for operating such apparatus.

Plasma discharges are extensively used in various manufacturing processes such as:

Fabrication of semiconductor devices.

Etching of plastic films for ink adhesion

Deposition of layers on plastic roll goods to reduce oxygen and water vapor diffusion for flexible packaging Etching and coating fibers and tows (bundle of fibers) to improve adhesion in composite materials or materials such as tire cords.

Etching and deposition on the inside of plastic bottles for increased hermeticity Etching and deposition on parts to reduce corrosion For example, a semiconductor substrate is disposed within an evacuated chamber coupled to a source of plasma. By appropriately biasing the substrate, the plasma is coupled to the substrate for ion bombarding the substrate, for etching patterns in the substrate, or depositing ions on the substrate to grow layers of selected materials thereon.

The present invention has particular utility with (although not restricted to) apparatus and processes described in U.S. Pat. No. 4,918,031, issued to me (Johnson), Flamm and Ibbotson on Apr. 17, 1990, the subject matter of such patent being incorporated herein by reference.

This patent discloses a plasma generating apparatus comprising an outside, cylindrical enclosure of metal, an internal helical coil, and an internal, open-ended tube of insulating material within the coil and concentric therewith. A low pressure gas is passed through the tube and ionized by high intensity electric fields generated within the tube by the coil. The ions, radicals, atoms, plasma fragments, or gas phase combined species of the plasma are used to process workpieces, e.g., semiconductor substrates disposed adjacent to an exit end of the tube or within the tube itself.

The patent also discloses the use of a longitudinally split, metallic shield disposed internally of the coil and surrounding the internal tube, and explains that the shield "is useful to adjust plasma species concentrations by application of a bias or to shield the plasma region from radial electric fields." However, except for schematically illustrating the split metallic shield and describing its function in the above quoted statement, the patent provides no significant disclosure concerning its details or use.

I have discovered, however, that the use of internal metallic shields provides important advantages in plasma apparatus of the type described in the patent, and the present invention provides novel shielding arrangements and novel processes for operating apparatus, including such shielding arrangements.

DESCRIPTION OF THE DRAWINGS

The figures are schematic views of various aspects of the inventive apparatus.

SUMMARY OF THE INVENTION

In one embodiment of the invention, a plasma generating apparatus includes a longitudinally split, metallic shield disposed within a helical coil and disposed around an internal plasma region. The shield, in contrast to the shield shown in the patent, allows a significant capacitive coupling between the coil and the plasma region. Such coupling can be obtained by the use of multiple slits through the shield or by the use of shields having a shorter axial length than the coil. In a novel use of such apparatus, the degree of capacitive coupling allowed through the shield is varied for tuning the characteristics of the plasma. Such variable capacitive coupling is obtained by varying the area of exposure of the coils through the shield to the plasma region, e.g., by varying the dimensions and/or the configuration of the slits through the shield.

In another embodiment of the invention, the coil comprises a planar spiral, and a multi-slotted, metallic, disc-like shield grounded at the outer diameter is disposed between the planar coil and the plasma region.

DESCRIPTION OF PREFERRED EMBODIMENTS OF THE INVENTION

Figure 1:
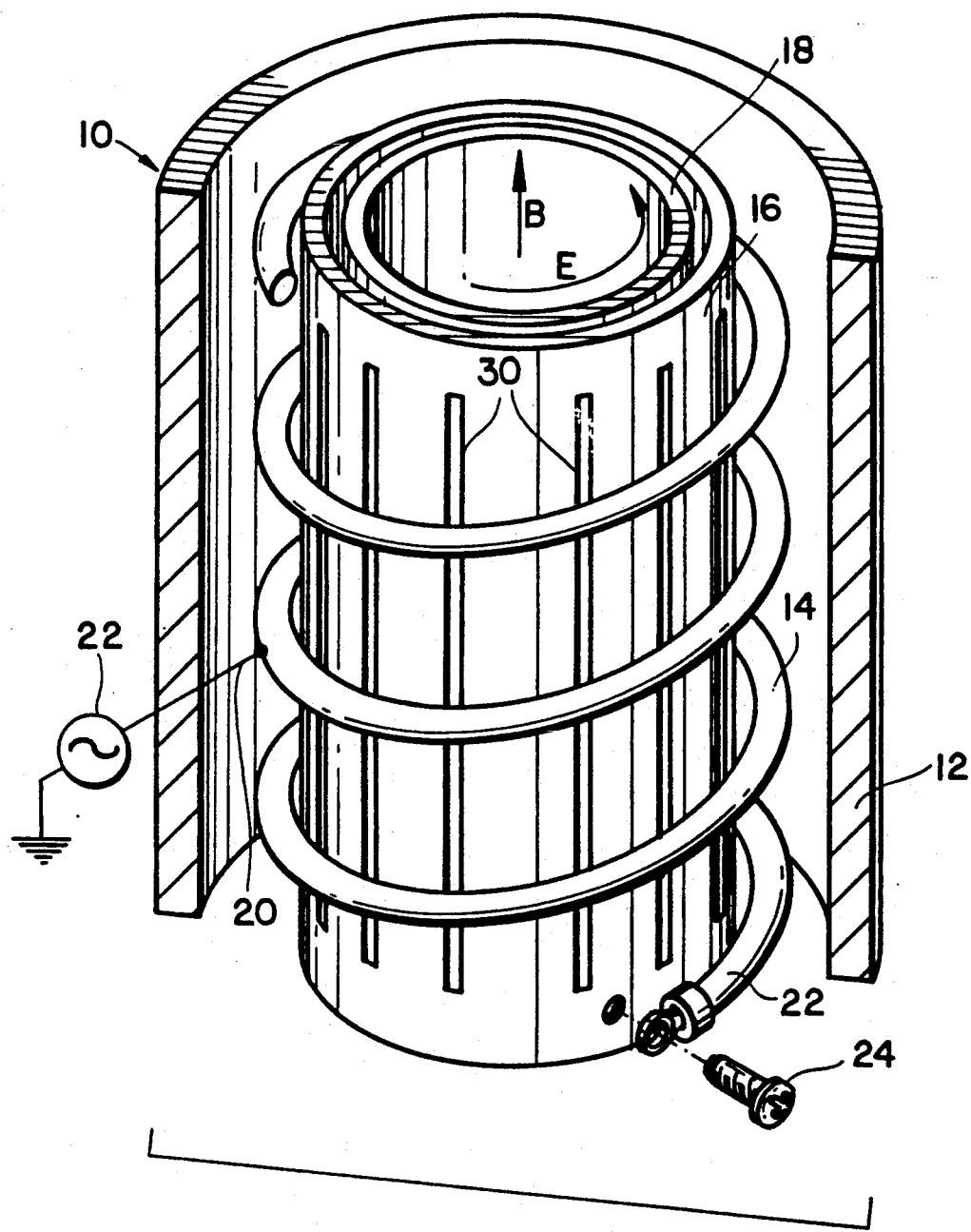
FIG. 1 is a perspective view, partially broken away, of one embodiment of the inventive apparatus.

With reference to FIG. 1, one embodiment of a plasma generating apparatus 10 according to the invention is illustrated. This embodiment is quite similar in appearance to the apparatus shown in FIG. 2 of the afore-described U.S. Pat. No. 4,918,031 and can be used in much the same manner as are the various plasma generating apparatuses disclosed in the patent. Significant differences, however, in the use of the inventive apparatus are described hereinafter.

The apparatus 10 shown in FIG. 1 includes an external enclosure 12 of metal, an internal helical coil 14 of metal, a slotted shield 16 of a nonmagnetic metal disposed concentrically within the coil 14, and an internal tube 18 of a low loss dielectric insulating material, e.g., of quartz. The enclosure 12, the coil 14 and the shield 16 can be, for example, of copper or silver plated copper.

The dimensions of the apparatus 10, and the means for energizing it, including applying an R.F. voltage to the coil 14, can be determined in accordance with known principles. Examples of apparatus designs and means for energizing them are provided in the afore-described patent.

Figure 2:
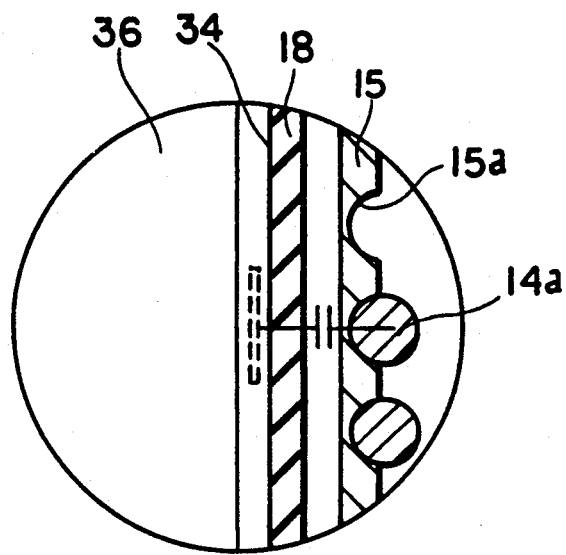
FIG. 2 is a fragmentary view showing a portion of an R.F. coil mounted on a supporting structure and illustrating a capacitive coupling between one of the coil turns and the inside of the plasma-containing inner tube.

The shield 16 can be mounted on the internal tube 18 in spaced apart relation therewith, as by insulating material shims, not shown, and the lower end 22 of the coil is electrically connected to the shield 16 by means of a screw 24. Alternatively, the shield can be deposited directly onto the internal tube 18. The coil 14 is sufficiently rigid to be self-supporting, although additional means, e.g., a rigid tube of insulating material can be used about which the coil 14 is wound and supported. An example of such a coil supporting tube 15 is indicated in FIG. 2.

Figure 9:
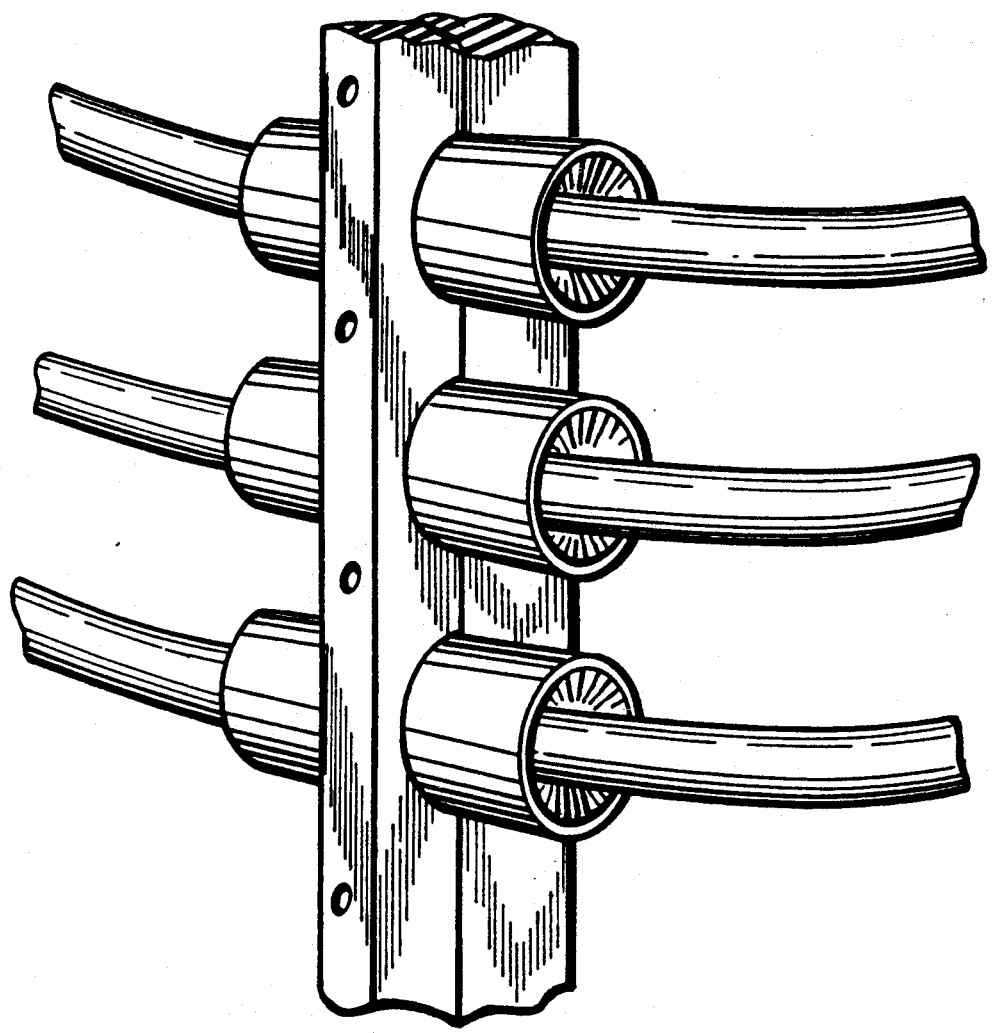
FIG. 9 shows an example of a high voltage insulator used to support the coil.

FIG. 9 shows an example of a high voltage insulator used to support the coil. It is important to realize that the shielded plasma operation requires a high voltage and high current on the coil to operate. In turn for the device to operate with reasonable input powers, the losses both dielectric and conductive (due to resistive losses in the coil and losses in its surface due to eddy currents), must be minimized. In other words, the coil system must operate at high Q. Except for the lower connection between the coil end 22 and the shield 16, the turns of the coil are spaced from the shield 16.

For example, with a coil 14 having an inner diameter of 350 mm, the shield 16 can have an outer diameter of 260 mm, and an inner diameter of 258 mm, and the tube 18 can have an outer diameter of 250 mm. These dimensions are not critical.

An electrical connection 20 is provided between one of the turns of the coil 14 and an R.F. power supply 22 that best matches the impedance of the supply.

The shield 16 is provided with a number of longitudinally extending and circumferentially spaced slits 30 therethrough. The parameters of the slits are a function of the particular apparatus and the function of the apparatus. This is discussed hereinafter. Of present significance, however, is that more than two slits 30 are provided. (The patent shows but a single "slit" for the purpose of avoiding the generation of low impedance, current carrying loops around the circumference of the shield, such loops being wasteful of energy and causing undesirable heating of the apparatus). The multiple slits 30 through the shield 16 further reduce the lengths of the current loops in the shield and improve efficiency. The electrical coupling between the coil 14 and the plasma region is now discussed.

An R.F. coil produces a combination of electric fields. The fields can be capacitively and/or inductively coupled to the plasma.

In the capacitive coupling mode, as illustrated in FIG. 2, the coil turns 14a are capacitively coupled through the dielectric tube 18, and the inside wall 34 of the tube becomes a capacitively coupled electrode. At any instant, the R.F. voltage on the coil varies along the length thereof, hence the voltage on the capacitive electrode on the inside wall 34 of the tube also varies along the length of the quartz tube. The difference in voltage between the various portions of the tube inner wall electrode creates an electric field within the tube 18 which is effective to ionize the molecules of the gas 36 passing through the tube.

In the inductively coupled mode, as illustrated in FIG. 1, the current in the coil 14, which is in the order of amperes, generates an intense R.F. magnetic field, B, extending axially of the tube 18. This magnetic field, in turn, generates a circular electric field, E, within the tube. The intensity of the electrical field rises and falls with the magnetic field intensity, and alternates in direction every half cycle.

In the absence of an electrically conductive shield, both capacitive and inductive couplings are present, but the capacitive coupling predominates. It has been discovered, however, that such predominantly capacitively coupled fields couple so efficiently with the plasma as to produce large and generally uncontrollable R.F. plasma potentials. These potentials lead to sputtering of the tube walls 34 and to excessively high energies of the plasma particulates. The wall sputtering causes contamination of the system, and the excessively high energy particles can damage the articles being processed by the plasma.

Also, the particles of the plasma are energized to a relatively wide range of energies, which is undesirable as introducing uncontrolled variations in the processing of articles by the plasma.

Attempts were made to overcome these problems by the use of metal shields of the type shown in the aforementioned patent. These shields of non-magnetic material allow penetration of the magnetic field produced by the R.F. coil into the plasma region while blocking capacitive coupling between the coil and the plasma region. Thus, with such shields in place, the coupling between the R.F. coil and the plasma region is totally inductive. Such inductive coupling is less efficient than capacitive coupling, and the large, uncontrollable R.F. plasma potentials, and the problems caused thereby are avoided.

A problem with such totally inductive couplings, however, is that owing to the relatively poor plasma coupling efficiency thereof, it is somewhat more difficult to initiate a plasma within the plasma tube and, in general, far more R.F. power is required in the plasma generating process. The need for greater R.F. power raises numerous problems with respect to the design of the R.F. coils and the supports thereafter capable of handling large R.F. powers and voltages.

I have discovered, however, that the problems of the prior art apparatus solved by the use of capacitive shields and the problems caused by the shields themselves can all be solved by the use of shields which provide only a partial, and preferably variable, capacitive shielding between the R.F. coil and the plasma region. Shields providing such partial shielding are described hereinafter.

It is first noted that the shield shown in the aforementioned patent is not perfect and does allow some capacitive coupling therethrough. The current, generated in a capacitance measurement however, is so low as not to be directly measurable by means available to me. I do know, however, that in an actual experimental shield of the type shown in FIG. 2 of the patent, the area of the single vertical slit through the shield is somewhat less than 0.2% of the total external area of the shield. Because the capacitance of a capacitor is a direct function of the area of the electrodes of the capacitor, it is assumed that the capacitive coupling allowed through the single slit shield of the patent is less than 0.2% of the capacitive coupling that would exist in the absence of the shield. Thus, for the purpose of distinguishing the present invention from the prior art, one definition is that the inventive shield allows a capacitive coupling between the R.F. coil and the plasma region which is at least in excess of 0.2% of what such capacitive coupling would be in the absence of the shield, all other parameters being the same. I have also discovered that allowing significant amounts of capacitive coupling can produce process effects comparable to separately biasing the articles being processed by the plasma with an R.F. voltage. The capacitive coupling of the coil to the plasma in a plasma chamber having dielectric walls allows the plasma potential with regard to the substrate to have an R.F. voltage imposed. This voltage produces a bias in the the same manner as the R.F. voltage applied to the substrate. Measurements of the plasma on shields typically provide R.F. plasma voltages with regard to a grounded substrate of several hundred volts. The same plasma configuration but with a shield has R.F. voltage of less than 1 volt R.F. By opening the shield any value between unshielded and totally shielded can be obtained.

Figure 3:
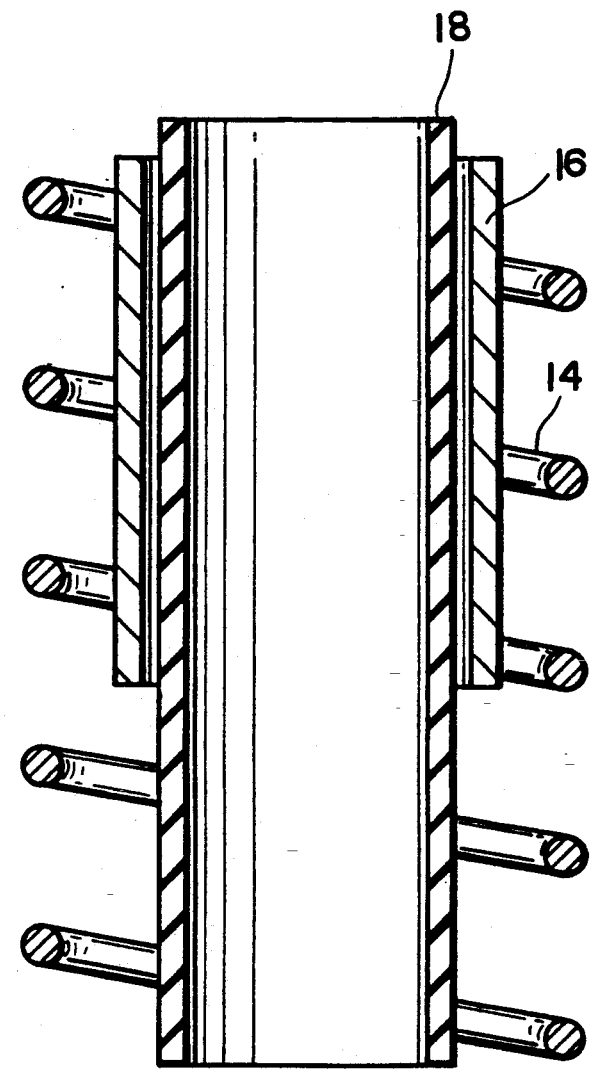
FIG. 3 is a vertical section showing a modification of the shield shown in FIG. 1.

As previously noted, the shield 16 includes 20 circumferentially spaced slits 30. In this embodiment, each slit has a length of 350 mm and a width of 1 mm. The shield 16 has an outside diameter of 260 mm and a length of 750 mm. With these dimensions, the 20 slits provide a ratio of open area through the shield (exposing the coil 14 to the tube 18) to total external shield area of around 1.14%. In experiments with shields of the type shown in FIG. 1, the following results were obtained in comparison with the use of single slit shields of the same type shown in the patent:

1.0 Increased power coupling 50% vs 85%
2.0 Increased operating range for the pressures of gases flowed through the plasma chamber from between 10E-4 to 25 torr to 10E-5 to 50 torr As shown in FIG. 1, the shield 16 is coextensive in length with the coil 14. One means for further increasing the capacitive coupling allowed through the shield 16 is, as shown in FIG. 3, to make it somewhat shorter than the axial length of the coil. For example, with a coil length of 240 mm, the shield can have a length of only 150 mm. The difference in length between the shield and coil is 90 mm, and, with a shield having the same parameters as the shield 16 shown in FIG. 1., with the sole exception of the length, the ratio of open area to total shield area is increased to 37%. That is, the length difference is considered as an opening through the shield.

I have also discovered that the conditions necessary for effective use of the plasma in various processes often differs from those used for initiating the plasma. Thus, by means of a variable capacitive coupling shield, a first, and relatively high amount of capacitive coupling can be provided and then, after the plasma has been established, the amount of capacitive coupling can be reduced for maintaining the plasma. This technique is particularly useful in connection with the use of gases with which it is difficult to initiate a plasma, e.g., Chlorine, at pressures below 10E-4 torr or above 50 torr. Thus, once the plasma has been initiated, making use of the high coupling efficiency provided by the capacitive coupling, the degree of capacitive coupling is reduced for avoiding the aforementioned problems associated with the use of capacitive couplings.

Electron bombardment of photoresist by capacitively coupled electric fields heats the photoresist and reduces its useful exposure time.

A quite simple means for varying the capacitive coupling through the capacitive shield is to provide mean for varying the shapes and dimensions of the slits through the shield and/or varying the axial position of the shields relative to the coil for uncovering or exposing more or less of the coil surface.

Figure 4:
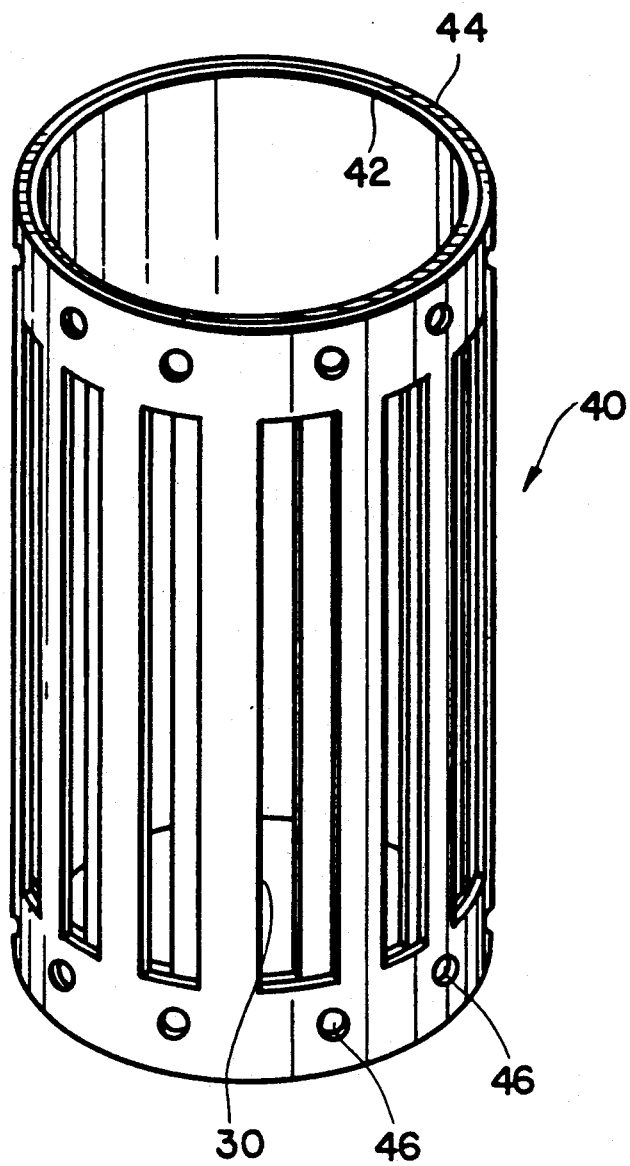
FIGS. 4, 5 and 6 are perspective views of the different two-piece shields according to this invention.

One example of the former means is shown in FIG. 4. Here, a shield 40 comprises 2 concentric shield portions 42 and 44 identical to one another except that the inner shield portion 42 has a slightly smaller diameter so as to fit snugly within the outer shield portion 44. As illustrated, the two shield portions are held together by screws 46, the screws 46 passing through holes in the outer portion 5 and pressing against the outer wall of the inner portion 42 to hold it in place. By loosening the screws, the inner portion can be rotated relative to the outer portion for displacing the slits in the two portions more or less relative to each other. Thus, the effective width of the shield slits can be varied for varying the capacitive coupling provided through the shield.

More easily adjusted shields can be provided. For example, the lower edge of the inner shield portion 42 can ride on an inwardly projecting, circumferential ridge through the lower wall of the outer shield portion 44 to allow free relative rotation between the two shield portions. Such rotation can be performed by means of a radially extending lever attached to the upper end of the inner shield portion. The lever can be moved manually, or automatically, by a process monitoring and controlling mechanism.

Figure 5:
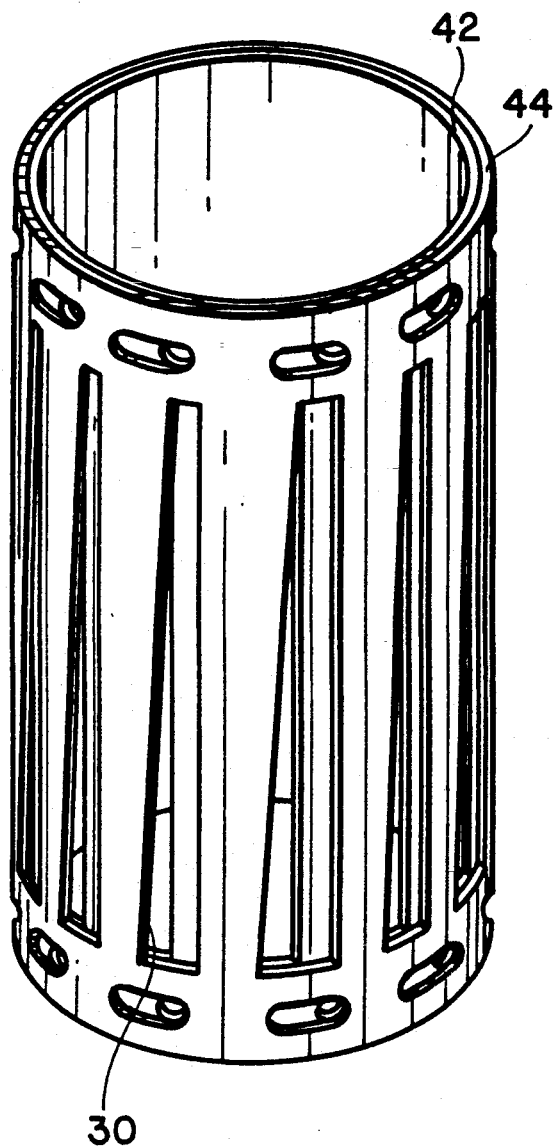
Figure 6:
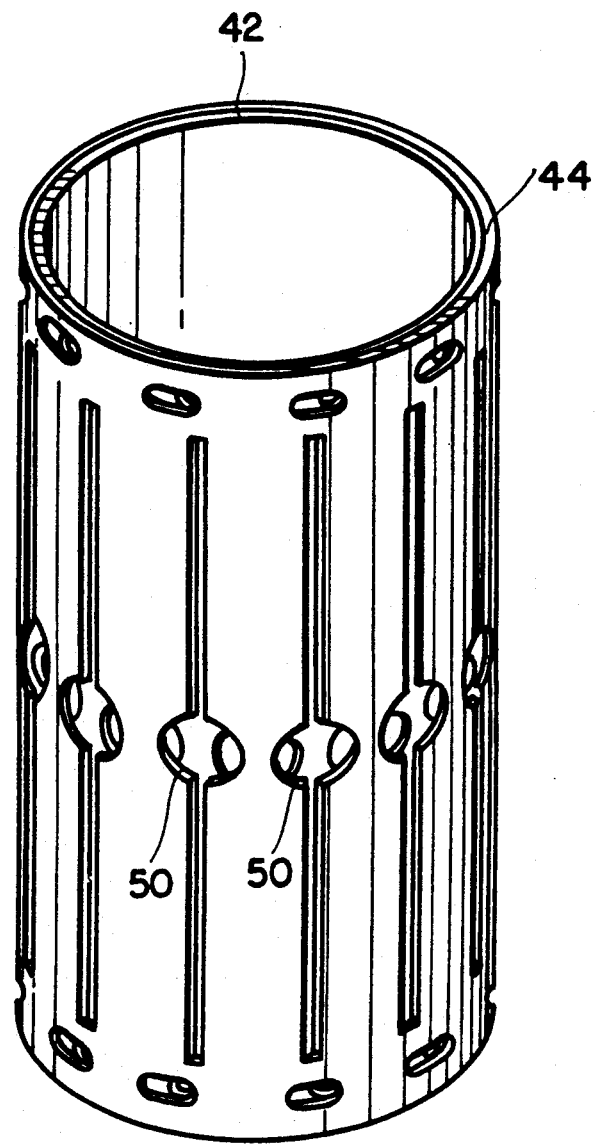

Variations of the shield shown in FIG. 4 are shown FIGS. 5 and 6.

In FIG. 5, the slits 30 are of varying width from top to bottom. In addition to providing a variable capacitive coupling between different settings of the shield portion 42 and 44, the longitudinally varied slit widths provide a capacitive coupling that varies along the length of the coil for any given setting of the two portions 42 and 44. An advantage of this shield is that a lower voltage portion of the coil is capacitively coupled to the plasma. Essentially, the shape of the slit in the shield determines the impedance of the bias supplied to the plasma.

In this shield shown in FIG. 6, each slit includes a single, enlarged circular opening 50. The opening controls the coupling from a single turn of the coil. An advantage of this is a specific impedance of coupling to the plasma.

Figure 7:
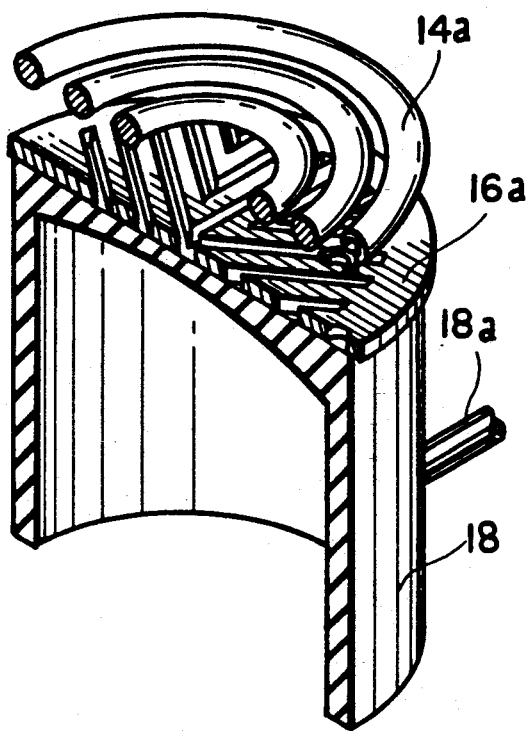
FIG. 7 is a fragmentary view in perspective showing a planar coil and shield combination.

In FIG. 7, the upper end of the tube 18 is closed (gases being admitted into the tube by means of a pipe 18a) and the coil 14a comprises a planar spiral that is mounted on the tube 18 (e.g., via shims, not shown). A slotted, disc-like shield 16a is disposed between the tube end and the coil 14.

Figure 8:
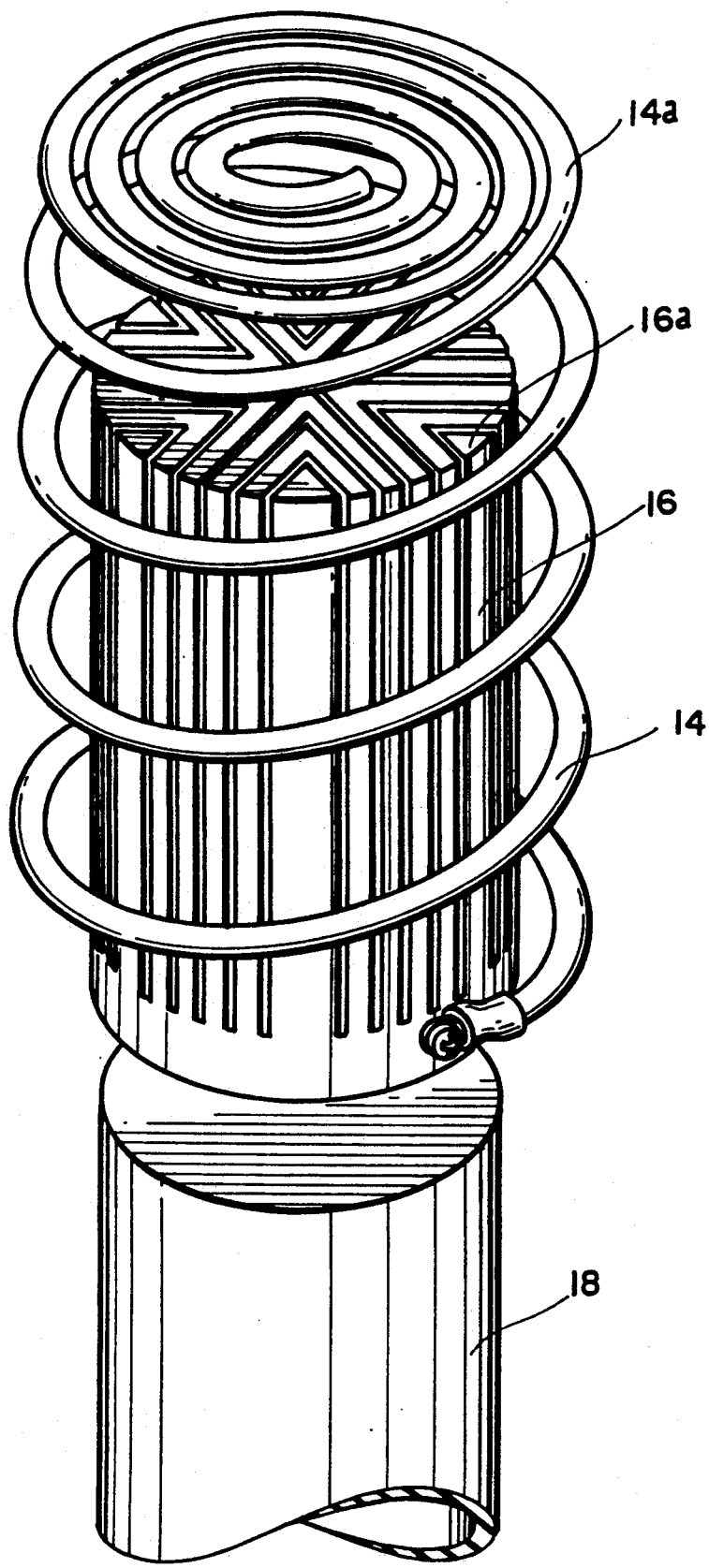
FIG. 8 is a perspective view showing a coil and shield each including both planar and cylindrical elements.

In FIG. 8, the spiral coil 14a is an extension of the helical coil 14, and the shield 16a is an integral top cap of the shield 16. The slits through the cylindrical wall of the shield continue into the top cap 16a and become chevrons in the top cap which provide low loss due to eddy currents.

What is claimed is:

1. A plasma discharge apparatus including a plasma containing region, an R.F. coil for generating electric fields within said region, a capacitive shield of a non-magnetic electrically conductive material disposed between said region and said coil, said shield reducing the capacitive coupling between said coil and said region from a first value that would exist in the absence of said shield while allowing a capacitive coupling between said coil and said region equal to at least 1% of said first value, and means for varying the exposure of said coil through said shield for varying the capacitive coupling between said shield and said region to values in excess of said at least 1% of said first value.

2. An apparatus according to claim 1 wherein said shield includes more than two openings therethrough for allowing said capacitive coupling between said coil and said region.

3. An apparatus according to claim 2 including means for varying the size of said openings for varying the amount of said capacitive coupling 4. An apparatus according to claim 1 wherein said shield comprises two relatively movable members disposed one behind the other between said region and said coil, each of said members having an opening therethrough providing a composite opening through both of said members for allowing said capacitive coupling between said coil and said region when said openings through said members overlap one another, the size of said composite opening being variable upon relative movement of said members for varying the degree of overlap of said openings.

5. An apparatus according to claim 4 wherein said members comprise two concentric hollow cylinders, and said coil is a helix concentric with said cylinders.

6. An apparatus according to claim 5 wherein said cylinders comprises a wall extending along a central axis common to both said cylinder, and said openings comprise axially extending slits in the cylinder walls.

7. An apparatus according to claim 6 wherein the widths of said slits vary along the lengths thereof.

8. An apparatus according to claim 6 wherein said slits are rectangular and each slit includes an enlarged, circular opening intermediate the ends thereof.

9. A plasma discharge apparatus including a plasma containing region, an R.F. coil for generating electric fields within said region, and a capacitive shield of a non-magnetic electrically conductive material disposed between said region and said coil, said shield reducing the capacitive coupling between said coil and said region from a first value that would exist in the absence of said shield while allowing a capacitive coupling between said coil and said region equal to at least 1% of said first value, and including a hollow tube enclosing said region, one end of said tube being closed by a generally flat plate, said shield comprising a plate-like member disposed adjacent to said flat plate, and said coil comprising a planar spiral.

10. An apparatus according to claim 9 including a cylindrical shield concentric with said hollow tube, said plate-like member comprising a cap at an end of said cylinder, and said coil comprises a helix concentric with said cylinder and terminating in said planar spiral.

11. A plasma discharge apparatus including a plasma containing region, an R.F. coil for generating electric fields within said region, and a capacitive shield of a non-magnetic electrically conductive material disposed between said region and said coil, said shield reducing the capacitive coupling between said coil and said region from a first value that would exist in the absence of said shield while allowing a capacitive coupling between said coil and said region equal to at least 1% of said first value, said shield comprising a hollow cylinder and said coil comprising a helix concentric with said shield, said shield capacitively shielding a first portion of the length of said helix from said region, and said helix having a second portion extending axially beyond an end of said shield and being capacitively exposed to said region.

12. A plasma discharge apparatus including a plasma containing region, an R.F. coil for generating electric fields within said region, a capacitive shield of non-magnetic electrically conductive material disposed between said region and said coil, said shield reducing the capacitive coupling between said coil and said region from a first value that would exist in the absence of said shield while allowing a capacitive coupling between said coil and said region equal to at least 1% of said first value, and said shield including more than two openings therethrough for allowing said capacitive coupling between said coil and said region.

* * * * *